(12) United States Patent
Ball

(10) Patent No.: US 6,279,976 B1
(45) Date of Patent: Aug. 28, 2001

(54) WAFER HANDLING DEVICE HAVING CONFORMING PERIMETER SEAL

(75) Inventor: Michael B. Ball, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/311,032

(22) Filed: May 13, 1999

(51) Int. Cl.$^7$ ................................................. B25J 15/06
(52) U.S. Cl. ............................................ 294/64.1; 414/941
(58) Field of Search ........................... 94/64.1–64.3; 414/752.1, 941; 901/40, 44; 324/537, 765; 271/90, 94, 102, 107; 269/21

(56) References Cited

U.S. PATENT DOCUMENTS

| | | | |
|---|---|---|---|
| H1373 | 11/1994 | Durham et al. | 414/786 |
| 2,853,333 | * 9/1958 | Littell | 294/64.1 |
| 3,154,306 | * 10/1964 | Elliott et al. | 294/64.1 |
| 3,230,002 | * 1/1966 | Olson | 294/64.1 |
| 4,600,229 | * 7/1986 | Oten | 294/64.1 |
| 4,917,427 | * 4/1990 | Scaglia | 294/64.1 |
| 4,931,341 | * 6/1990 | Haffer et al. | 294/64.1 |
| 4,983,093 | 1/1991 | Foulke et al. | 414/416 |
| 5,013,075 | 5/1991 | Littell | 294/64.1 |
| 5,100,287 | 3/1992 | Burck et al. | 414/786 |
| 5,261,776 | 11/1993 | Burck et al. | 414/416 |
| 5,642,298 | * 6/1997 | Mallory et al. | 414/941 |
| 5,961,169 | * 10/1999 | Kalenian et al. | 414/941 |
| 6,043,458 | * 9/1958 | Fortune | 294/64.1 |
| 6,099,597 | * 8/2000 | Yap et al. | 294/64.1 |

* cited by examiner

*Primary Examiner*—Dean J. Kramer
(74) *Attorney, Agent, or Firm*—Schwegman, Lundberg, Woessner & Kluth, P.A.

(57) ABSTRACT

A vacuum-assisted chuck assembly for coupling to a warped semiconductor wafer is provided. In one embodiment, the assembly comprises a wafer chuck and a conforming perimeter seal. The seal permits effective vacuum coupling of the chuck to the warped wafer without operator intervention. As vacuum pressure is applied, the seal prevents leakage around the warped wafer, allowing the vacuum pressure to deflect the wafer until the wafer contacts and seals against an engaging surface located on the chuck. By utilizing the seal, the chuck assembly may operate at a reduced vacuum pressure as compared to conventional wafer chucks. Furthermore, by providing an effective vacuum seal to the warped wafer surface, manual operator intervention during vacuum coupling is reduced or eliminated.

47 Claims, 6 Drawing Sheets

WAFER HANDLING DEVICE HAVING CONFORMING PERIMETER SEAL

TECHNICAL FIELD

This invention relates generally to semiconductor processing and, more particularly, to an improved apparatus and method for handling warped semiconductor wafers.

BACKGROUND OF THE INVENTION

Automated wafer handling equipment is heavily employed during the fabrication of semiconductor wafers. Generally speaking, wafer handling equipment includes those devices used to transfer a wafer from one location to the next or to secure a wafer during a particular process. It is critical that these devices engage the wafer in such a way that refrains from damaging the fragile circuits located on the wafer face. One apparatus that satisfies this requirement is a vacuum-assisted coupling device. This device operatively engages the wafer surface with sufficient vacuum pressure to secure the wafer thereto. Although various vacuum-assisted devices are used throughout wafer fabrication, the present invention relates primarily to a vacuum-assisted retaining chuck for securing a wafer during processing and the remainder of the discussion will focus on the same.

The vacuum chuck has a generally planar engaging surface for coupling to the wafer surface. In communication with the engaging surface is a vacuum port. The chuck is brought into contact with a first or face side of the wafer and a vacuum source coupled to the vacuum port is activated. As the vacuum is drawn, the wafer is pulled into contact with the engaging surface. The combination of vacuum pressure and the frictional forces resulting between the wafer and the engaging surface securely retain the wafer relative to the chuck. Vacuum chucks are used on many wafer processing machines including, for example, backgrinders and wafer inspection equipment. Unlike vacuum transfer devices which need only support the wafer during transport, the vacuum chuck rigidly holds the wafer while the latter is subjected to various external forces introduced during wafer processing.

While the vacuum chuck performs more than adequately with flat wafers, problems occur when the wafer is warped. Wafer warpage may result from various thermal, mechanical, and chemical processes. Since a warped wafer cannot lie flat against the engaging surface of the vacuum chuck, vacuum leaks form therebetween. These leaks prevent the chuck from adequately sealing with the wafer. As a result, the wafer may shift or even dislodge from the chuck.

To alleviate this problem, some chucks provide an O-ring seal member proximal the perimeter of the chuck. The O-ring acts as a cushion and can improve sealing against wafers having slight warp. Unfortunately, the O-ring is ineffective in attempting to seal against wafers having significant warp.

Current techniques used to couple warped wafers to the vacuum chuck include, for example, utilizing relative high vacuum pressure. Unfortunately, higher vacuum pressure requires more expensive vacuum sources and more energy to operate. Another wafer coupling technique involves pressing the wafer against the chuck, generally by hand, as the vacuum is drawn. By momentarily deflecting the wafer in this way, the planar surface seals against the wafer and permits an effective vacuum. While effective in some circumstances, this practice is time consuming and requires operator intervention. In addition, this manual technique may cause damage to the wafer surface. Furthermore, if the wafer slips off the chuck, potential injury to the operator may result.

Thus, there are unresolved issues with current wafer vacuum chucks. What is needed is a chuck that can easily couple to a significantly warped wafer. What is further needed is a vacuum chuck that can couple to a warped wafer without operator intervention and while operating at relatively low vacuum pressures.

SUMMARY OF THE INVENTION

A device adapted to vacuum-couple to an object having a non-conforming surface is disclosed. In one embodiment, the device comprises an engaging surface adapted to receive the object and one or more vacuum ports in communication with the engaging surface. The device further includes a conforming sealing member extending around a perimeter of the engaging surface. The sealing member is adapted to form an air-tight seal between the engaging surface and the non-conforming surface and maintain the air-tight seal until the non-conforming surface deflects, under application of vacuum pressure, sufficiently to conform and seal against the engaging surface.

A method of vacuum-coupling a device to an object having an irregular surface is similarly provided. In one embodiment, the method comprises providing a coupling device. The coupling device has an engaging surface with at least one vacuum port in communication therewith and a flexible sealing member extending around a perimeter of the engaging surface. The engaging surface is adapted to receive the object. The method furthermore comprises positioning the engaging surface proximal the object and activating a vacuum source fluidly coupled to the vacuum port to create vacuum pressure at the vacuum port. By deforming the sealing member under vacuum pressure, the sealing member conforms to the irregular surface and seals thereto. By continuing to apply vacuum pressure, the object deflects and is drawn to the engaging surface where the object forms a vacuum seal with the engaging surface.

In another embodiment, a vacuum chuck assembly for receiving and fixedly retaining a semiconductor wafer having a warped surface is provided. The chuck assembly comprises a vacuum chuck having a planar engaging surface adapted to seal against and retain the wafer, and one or more vacuum ports in communication with the engaging surface. The chuck assembly further includes a conforming flexible cup extending around a perimeter of the engaging surface, the cup adapted to form an air-tight seal between the engaging surface and the warped surface. The cup maintains the air-tight seal until the warped surface deflects, under application of vacuum pressure, sufficiently to conform and seal against the engaging surface.

In yet another embodiment, a vacuum chuck assembly for receiving and retaining semiconductor wafers having a warped surface is provided. Here, the chuck assembly comprises a cylindrical vacuum chuck having: a face side, the face side having a planar, ring-shaped engaging surface adapted to contact the wafer and a recessed portion bounded by the engaging surface; and a backside adapted to attach the chuck to a chuck receiving component. The assembly further comprises at least one vacuum port located on the recessed portion wherein the vacuum port is adapted to fluidly couple to a vacuum source. In addition, the assembly includes a conforming flexible cup extending around a perimeter of the engaging surface, the cup adapted to form an air-tight seal between the engaging surface and the warped surface. The cup maintains the air-tight seal at least until the warped surface deflects, under application of vacuum pressure, sufficiently to conform the cup to the engaging surface. The cup further includes a flared lip which extends outwardly from the chuck in a funnel-like manner and terminates at a lip edge.

In still yet another embodiment, a wafer inspection apparatus is provided, comprising: one or more transducers adapted to measure a semiconductor wafer; and a vacuum chuck assembly operatively connected to the apparatus. The chuck assembly comprises: a chuck having an engaging surface and a vacuum port in communication with the engaging surface; and a flexible seal coupled to the chuck and extending around a perimeter of the engaging surface. The flexible seal is adapted to conform to the wafer and permit effective vacuum sealing of the wafer to the engaging surface regardless of surface irregularities in the wafer.

Advantageously, the present invention permits effective vacuum sealing of a semiconductor wafer to a vacuum chuck assembly regardless of wafer warpage. By effectively providing a vacuum seal to the warped wafer surface, manual intervention is not required to ensure coupling to the chuck assembly. Furthermore, the present invention permits effective vacuum sealing at lower vacuum pressures.

BRIEF DESCRIPTION OF THE DRAWINGS

The present invention will be further described with reference to the drawings, wherein.

DETAILED DESCRIPTION OF THE EMBODIMENTS

Figure 1:
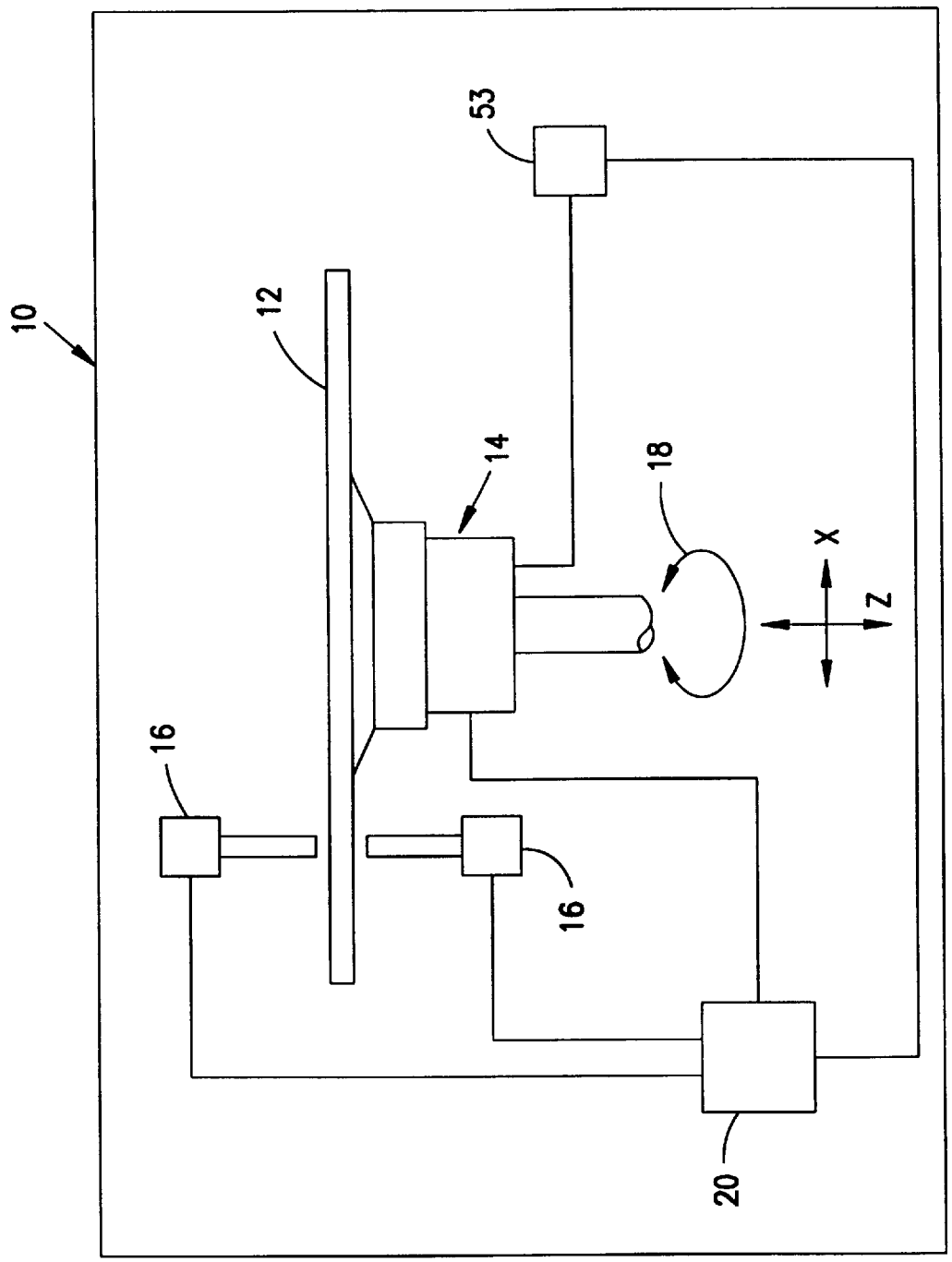
FIG. 1 is an diagrammatic view of a vacuum chuck assembly as shown in a wafer inspection apparatus in accordance with one embodiment of the invention.

In the following detailed description of the embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

In its broadest form, the invention described herein is directed to a device that can securely vacuum-couple to a surface of an object wherein the surface is irregular or otherwise non-conforming. Vacuum-coupling is the process of attaching a device to an object by placing the device proximal to the object and creating a suction (vacuum pressure) therebetween. The suction draws the object toward the device until an air-tight seal is formed.

The vacuum-coupling device of the present invention typically has an engaging surface incorporating a vacuum port thereon. The engaging surface has a shape complimentary to that of the object so that, when properly coupled, the object is in contact with and sealed to the engaging surface. The vacuum port is coupled to a vacuum source which draws a vacuum through the port when the vacuum source is activated. Vacuum pressure draws the object to the engaging surface wherein the object remains securely retained to the device until vacuum pressure is released. To prevent leakage of vacuum pressure between an object having an irregular surface and the device's engaging surface, the device of the present invention also incorporates a conforming sealing member or perimeter seal extending around the perimeter of the engaging surface. When the vacuum is activated, the conforming perimeter seal conforms to the irregular surface, forming an air-tight seal between the device and the object. As the vacuum increases, the object deflects and is drawn toward the device until the object contacts the engaging surface. The perimeter seal deforms accordingly to accommodate the deflecting object.

While the invention has many uses, one particularly advantageous application is in the field of semiconductor wafer handling. Semiconductor wafers must be transported between and securely retained at various process stations throughout fabrication. While manual and mechanical techniques exist, many processes utilize vacuum-assisted devices. Vacuum "wands" or arms, for example, are often used to transfer wafers from one location to the next. Vacuum chucks, on the other hand, utilize vacuum pressure to precisely hold a wafer to a known datum while the wafer is subjected to a particular process. For instance, a vacuum-assisted wafer chuck is commonly used to hold a wafer during surface inspection, backgrinding operations, and other fabrication processes. While the present invention is applicable to various vacuum-assisted devices, it is particularly advantageous to a vacuum chuck for use with a wafer inspection apparatus. For the sake of brevity, the remainder of this discussion will focus on the same. However, the reader is advised that vacuum chucks used elsewhere in wafer fabrication (e.g., backgrinding operations) are also within the scope of the invention. Furthermore, the invention is not limited to vacuum chucks or, for that matter, semiconductor vacuum-assisted handling equipment in general. Rather, it may be used to improve vacuum-coupling to most any object.

Semiconductor wafers are generally planar. However, various thermal, mechanical, and chemical fabrication processes may introduce wafer warpage or bow. Warpage is technically defined as the difference between the maximum and minimum distances of the median surface from a reference plane of a free, unclamped wafer. Bow is the deviation of the center point of the median surface of the free, unclamped wafer from a median-surface reference plane established by three points equally spaced on a circle having a diameter less than the nominal diameter of the wafer (see generally ASTM F1241). While warpage and bow are indicative of different surface irregularities, for simplicity the term "warpage" will hereinafter be used to refer generically to any irregularity in the wafer surface. However, the use of the term warp is not to be taken in a limiting sense as the invention applies equally to bowed or other irregular wafers.

Referring now to FIG. 1, a wafer inspection apparatus 10 is diagrammatically illustrated. The wafer inspection apparatus 10 is used to measure various wafer characteristics including thickness and flatness. The apparatus supports a circular wafer 12 on a cylindrical vacuum chuck assembly 14. Transducers 16 measure the surface variation of the wafer 12 at various locations on the wafer surface. The chuck assembly 14 may rotate the wafer 12 in a direction 18. In addition, the chuck assembly 14 may move linearly in the X and Z directions. Accordingly, the apparatus 10 can position most any point on the wafer surface proximal the transducers 16. A central controller 20 monitors, among other criteria, chuck position and transducer output.

Figure 2:
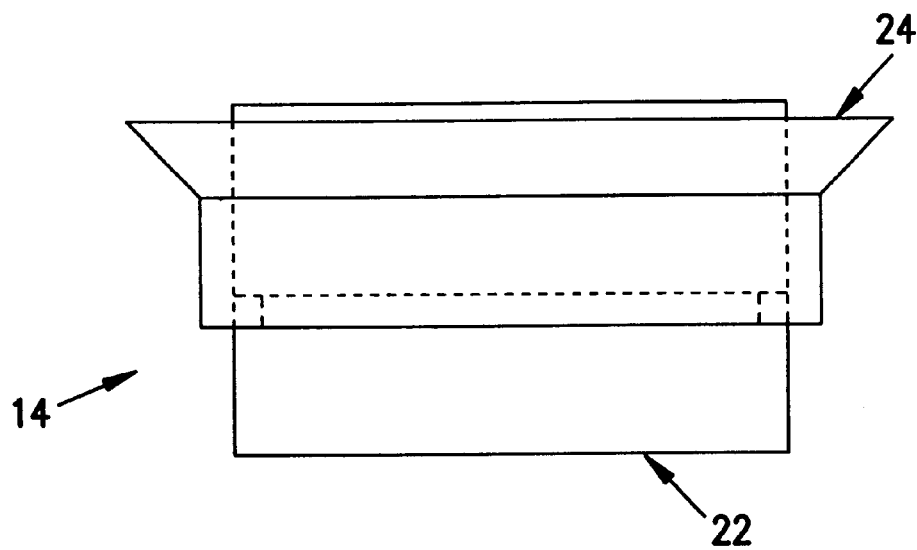
FIG. 2 is an enlarged side view of the vacuum chuck assembly of FIG. 1.
Figure 3:
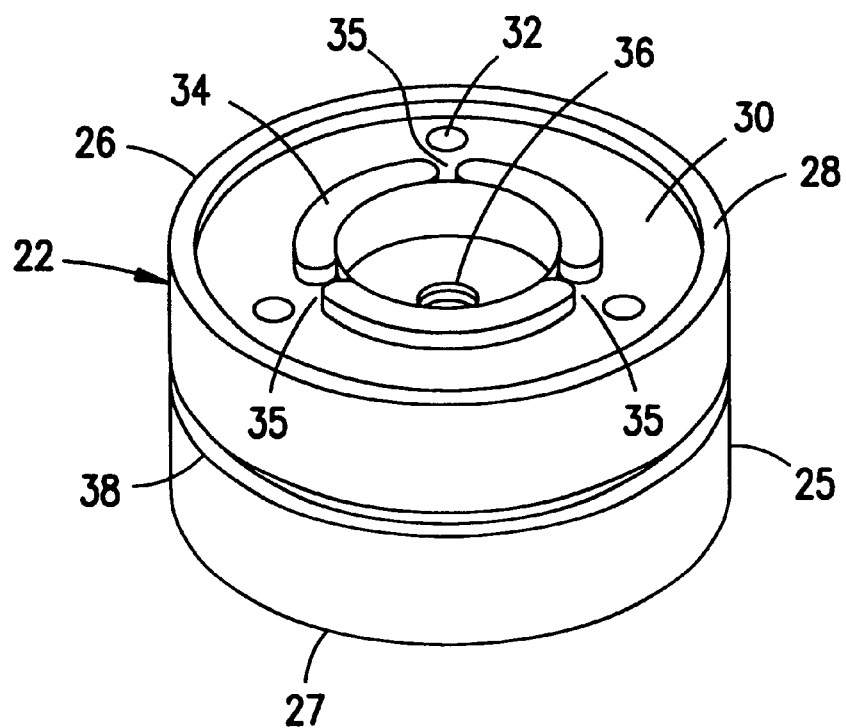
FIG. 3 is a perspective view of the vacuum chuck assembly of FIG. 1 with the flexible cup removed for clarity.

Referring now to FIGS. 2 and 3, the chuck assembly 14 is shown in greater detail. The chuck assembly comprises a chuck 22 and a conforming flexible seal or cup 24. In FIG. 3, the cup 24 is omitted for clarity. The chuck 22 has a face side 26 which couples to the wafer 12 and a backside 27 which operatively couples to the apparatus 10. The face 26 includes a generally planar engaging surface 28 adapted to physically abut against the wafer surface and rigidly support the wafer during processing. The engaging surface, in one embodiment, forms a ring. This geometry permits the chuck to evenly support the round wafer and prevent undue deflection when the wafer is subjected to external loading (e.g., inertial loading from rotation in the direction 18). While the engaging surface 28 is shown as round, other shapes are also possible within the scope of the invention.

Bounded on its outer perimeter by the surface 28 is a recessed portion 30. The recessed portion 30 has one or more vacuum ports 32 located therein. During use, the vacuum ports 32 apply vacuum pressure to pull the wafer (not shown) to the engaging surface 28. Toward the center of the face 26 are a plurality of extension surfaces 34. The extension surfaces 34 are generally coplanar with the engaging surface 28 for reasons that will become evident shortly. In one embodiment, there are three extensions surfaces each separated from the other by a gap 35. At the center of the face 26, a countersunk through-hole 36, which may or may not be threaded, is provided to permit mounting of the chuck 22 to the apparatus 10. While shown as a through-hole, other fastening means may also be used to secure the chuck 22 to the apparatus 10. For example, the outer portion of the chuck may be threaded. Alternatively, the chuck may include a flange accommodating several fasteners for fastening the flange to the apparatus 10. In still yet another embodiment, an adhesive may secure the chuck to the apparatus. Accordingly, various, mechanical, adhesive, and other methods may be used to secure the chuck to the apparatus 10.

Figure 5:
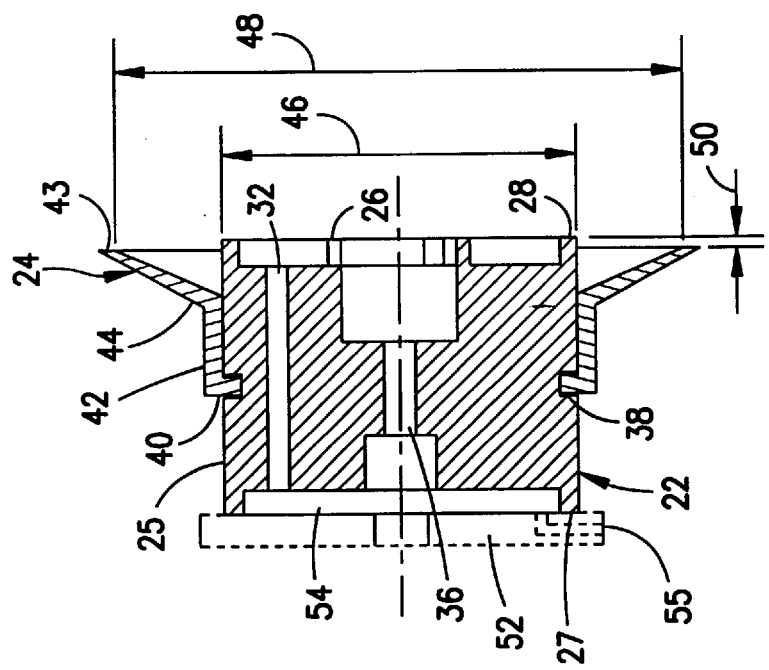
FIG. 5 is a section view of the vacuum chuck assembly of FIG. 4 taken along line 5—5 of FIG. 4.
Figure 4:
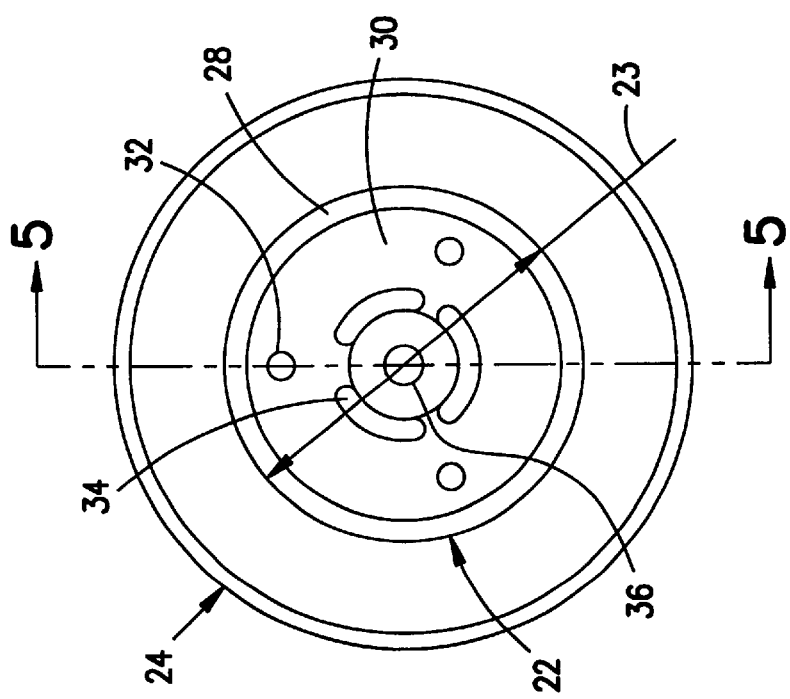
FIG. 4 is a plan view of the vacuum chuck assembly of FIG. 2.

The chuck 22 also includes a circumferential groove 38 located on its outer surface 25. The purpose of the groove 38 is to retain the cup 24 as generally shown in FIGS. 2, 4, and 5. While the embodiments shown retain the cup 24 within the groove 38, the exact retainment method is not central to the invention. Accordingly, other retaining methods (e.g., adhesives, mechanical fastening, interference fit, etc.) may also be used and still fall within the scope of the invention.

While the chuck 22 may be made from a variety of materials, it is in one embodiment made from a plastic material such as DELRON™. While plastic is less likely to cause damage to the wafer surface during use, other non-metallic and metallic materials may also be used. To further reduce damage to the wafer surface, a protective layer may be applied over the wafer surface prior to vacuum-coupling.

Referring now to FIG. 4, the chuck 22 with the flexible cup 24 attached is shown. The extension surfaces 34 and vacuum ports 32 are clearly evident in this view. The interrelation of the cup 24 and the chuck 22 is more clearly shown in FIG. 5. In this exemplary embodiment, the cup 24 attaches to the chuck 22 by engaging the groove 38 with a flange 40. The flange 40 positively retains and seals the cup 24 against the groove wall when vacuum pressure is applied.

While the exact dimensions of the lip flange are not critical, it is in one embodiment sufficient to retain the cup 24 to the chuck 22. While not necessary for effective sealing, the flange is, in another embodiment, adhesively secured in the groove 38. Other embodiments of the cup may exclude the flange 40 in its entirety without departing from the scope of the invention.

At the opposite end of the cup 24 proximal the face 26 is a diverging or flared lip 44. The lip diverges from a first diameter 46 proximal the outer surface 25 of the chuck to a second diameter 48 in a funnel like manner. In one embodiment, the lip 44 does not extend beyond the surface 28 but is rather offset a slight distance 50. Stated alternatively, the surface 28 extends beyond the lip by the distance 50. The distance 50 may be varied depending on the particular application. In another embodiment, the distance 50 may be zero. In still yet another embodiment, the lip 44 may extend beyond the surface 28. The lip 44 terminates at a lip edge 43. While shown in FIG. 5 as generally planar and parallel to the engaging surface 28, the lip edge 43 may assume a variety of shapes (e.g., angled, rounded) without departing from the scope of the invention.

Intermediate the flange and the flared lip is a cup wall 42. In one embodiment, the first diameter 46 may be smaller than the outer diameter 23 (see FIG. 4) of the chuck 22 such that an interference fit exists between the cup wall and the chuck. In another embodiment, the first diameter 46 may be larger than the outer diameter 23 such that a slight gap exists therebetween.

Still referring to FIG. 5, The chuck 22 may include a fastener (not shown) that couples the chuck to a chuck receiving component 52. In one embodiment, the fastener passes through the face side 26 and into the hole 36 and secures the backside 27 to the component 52. In another embodiment, the receiving component 52 has a male stud (not shown) which engages a threaded wall in the hole 36. When attached, a sealed space 54 is defined between the component 52 and the backside 27. The component 52 has a vacuum port 55 extending from a vacuum source 53 (see FIG. 1) to the space 54. The space 54 is in fluid communication with the ports 32 such that, when the vacuum source 53 is activated, vacuum pressure is applied at the ports 32.

Referring still to FIG. 5, the cup 24 is, in one embodiment, formed from a unitary piece of pliable, flexible material that is impermeable to air so that it may maintain a vacuum. To ensure that the lip adequately conforms to the wafer, the lip 44 must be compliant. Many factors affect lip compliance including the lip thickness, durometer (hardness) of the cup material, the geometry of the cup wall 42, the angle and extent of the lip flare (i.e., the difference between the first and second diameters 46, 48), and other variables.

In one embodiment, the cup 24 is made of a soft rubber material having a thickness that varies from approximately 0.065 inches at the flange to approximately 0.018 inches at the lip edge 43. It has a first diameter 46 of approximately 0.76 inches (before installation to the chuck) and a second diameter 48 of approximately 1.20 inches (undeflected). The distance 50 is approximately 0.050 inches. In one embodiment, the cup 24 performs adequately when used with a vacuum pressure of 5–12 in Hg.

While sufficient lip compliance is necessary to seal against the warped wafer, it is also important to prevent the lip from "folding-in" or collapsing. That is, the lip should have minimal rigidity to prevent the lip or lip edge 43 from being drawn between the wafer and the engaging surface 28 when subjected to the maximum vacuum pressure. In the embodiment shown in FIGS. 1–5, the geometry of the cup 24 has several features that prevent collapse. For instance, the circular shape of the lip and the integral cup wall tend to prevent folding-in. In addition, the greater the lip flare (the difference between the first diameter 46 and the second diameter 48), the greater the ability of the lip to avoid collapse.

In one embodiment, the cup 24 is substantially identical to a cup component used in a conventional die attach apparatus. In the die attach application, the cup is used to vacuum couple to a compliant, flexible tape backing to assist in removing the backing from individual semiconductor dies. Unlike the present invention, the die attach application does not require the cup to conform to warped or bowed items, but rather, relatively flat semiconductor dies. While one embodiment of the present invention is described in terms of this particular die attach component, those skilled in the art will realize that other applications may dictate different embodiments still within the scope of the invention. For example, other cup materials, geometries, and sizes may be used. Accordingly, the embodiments described herein are exemplary only.

The cup 24 mounts to the chuck, which in one embodiment, has an outer diameter 23 (see FIG. 4) of approximately 0.92 inches. Accordingly, when used with the exemplary embodiment of the cup described above (e.g., having a diameter 46 of 0.76 inches), the cup must expand or stretch to accommodate the chuck. This interference fit provides a seal between the cup wall 42 and the chuck 22. Other cups having a clearance fit with the chuck are also within the scope of the invention. When a clearance exists, the cup seals against the chuck by deforming under application of vacuum pressure.

Figure 6A:
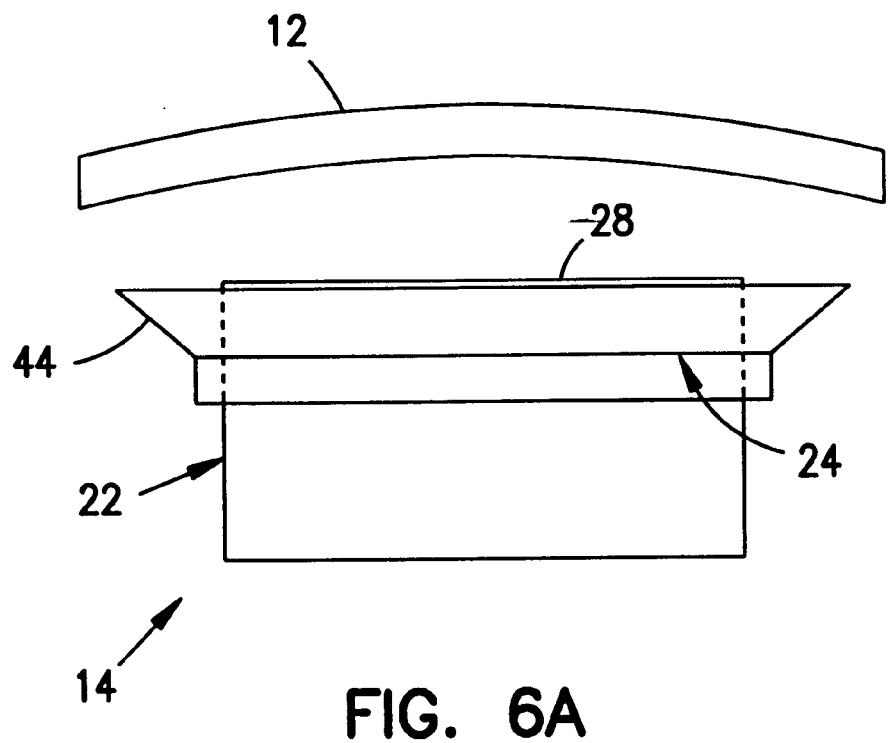
FIGS. 6A–6D are schematic side elevation views illustrating a method of vacuum coupling a wafer to a vacuum chuck assembly in accordance with one embodiment of the present invention.
Figure 6B:
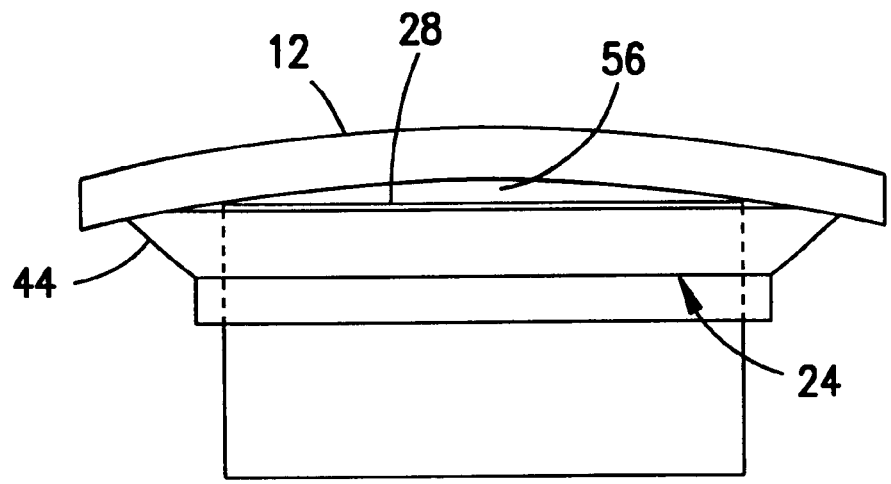
Figure 6C:
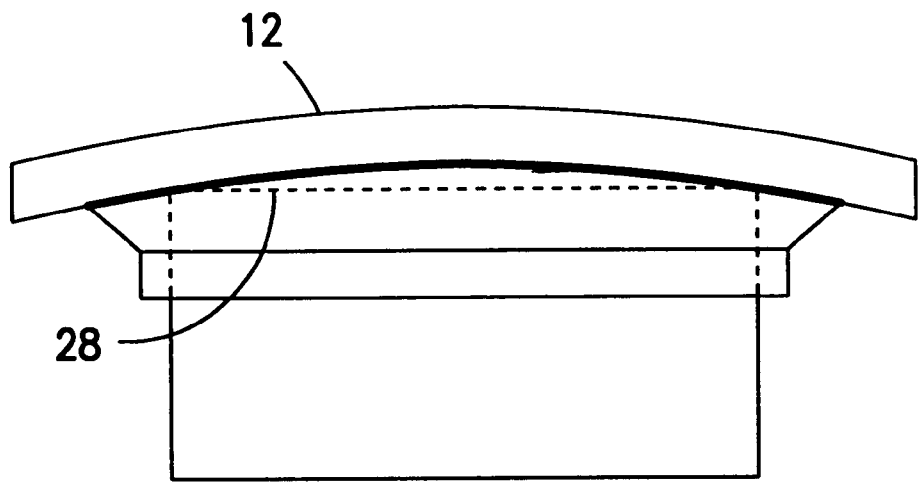

Having described the chuck assembly in some detail, attention is now directed to a method of securing a wafer to the chuck assembly in accordance with one embodiment of the invention as illustrated in FIGS. 6A–6D. Referring first to FIG. 6A, the wafer 12 may be positioned above the chuck assembly 14 by any number of means. For example, a robotic arm (not shown) having a small vacuum-coupling or mechanical gripping means may pick up the wafer 12 and place it on the chuck assembly 14. Alignment means may also be included to ensure the center of the wafer corresponds to the center of the chuck assembly. As the wafer 12 is set upon the chuck assembly 14, the wafer 12 will, depending on the degree of warp, contact the engaging surface 28 at one or more locations as shown in FIG. 6B. The wafer 12 may also contact the cup 24. In case of the latter, the cup deforms slightly under the wafer weight as also illustrated in FIG. 6B. Due to the warped surface of the wafer, one or more gaps 56 exist between the surface 28 and the wafer 12 prior to application of vacuum pressure. However, because the cup 24 is flexible, it deforms when vacuum pressure is applied, thus conforming to the wafer surface. In particular, when activated, the vacuum pressure pulls the cup lip 44 inwardly in the vicinity of the gap 56. As such, the cup lip fills the gap 56 and conforms to the wafer surface as illustrated in FIG. 6C.

Figure 6D:
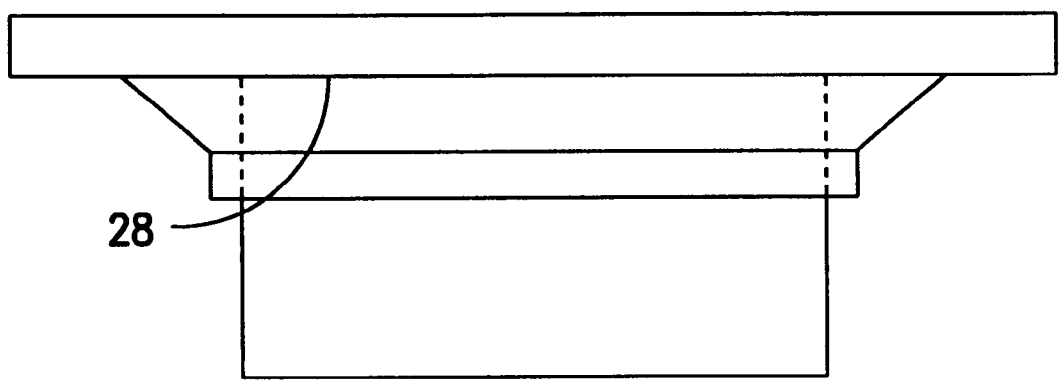

As the vacuum pressure continues, the cup 24 eventually seals around the entire perimeter of the chuck. The vacuum pressure also draws the flange 40 (see FIG. 5) and the cup wall 42 into contact with the chuck 22 (if not already in contact), thereby sealing any potential leaks around the groove 38. Accordingly, vacuum leaks are eliminated and the vacuum pressure begins to draw the wafer to the engaging surface 28 of the chuck 22. The wafer eventually deflects sufficiently under application of vacuum pressure so that it contacts and seals to the engaging surface 28. The extension surfaces 34 (see FIGS. 3–4) prevent the wafer from over-deflecting at the chuck center during application of vacuum pressure. When the wafer is completely secured, it lies flat against the engaging surface 28 and the coplanar extension surfaces 34. The pressure interior to the extensions surfaces remains identical to the pressure in the recessed area 30 due to the gaps 35 (see FIG. 3). Accordingly, the wafer is drawn to the chuck and maintained in a relatively flat orientation as shown in FIG. 6D.

The use of the flexible perimeter cup 24 with the wafer vacuum chuck 22 significantly improves wafer retainment. In one embodiment, wafers exhibiting moderate warpage (i.e., 8.00 inch diameter wafers having warp of approximately 600 microns) were effectively secured without operator intervention. In addition, because the cup forms an effective vacuum seal, the vacuum pressure was reduced from 25 in Hg to approximately 5 in Hg without any adverse effect on wafer retainment.

Figure 7:
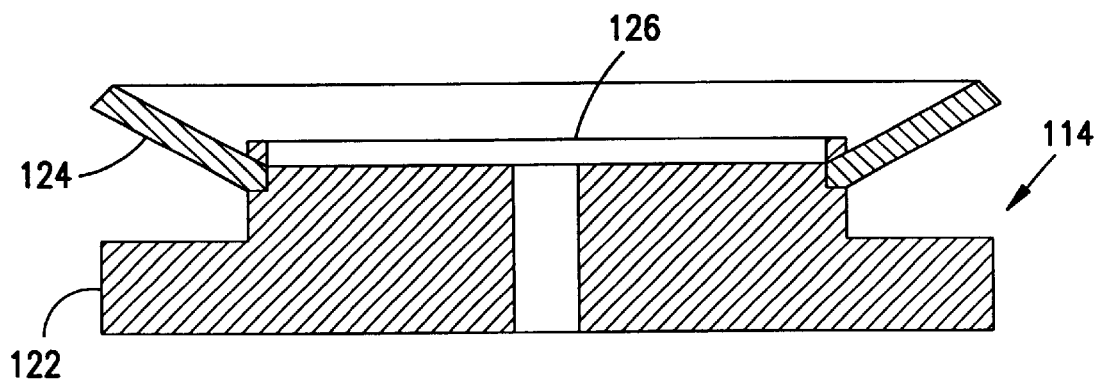
FIG. 7 is a section view of a vacuum chuck assembly in accordance with another embodiment of the invention.

While described herein in terms of a specific embodiment of the chuck assembly as shown in FIGS. 1–6, other vacuum chuck assemblies are also possible within the scope of the invention. For example, FIG. 7 shows a vacuum-assisted chuck assembly 114 in accordance with yet another embodiment of the invention. Here, the cup lip 124 diverges more significantly from the face 126 of the chuck 122. This particular geometry permits the lip to deform more easily by deflecting towards the chuck (i.e., away from the wafer or downwardly in FIG. 7). In addition, this particular chuck assembly reduces the overall size of the cup by reducing or eliminating the cup wall, the cup flange, or both. Thus, potential cost savings may be realized.

The vacuum chuck assembly of the present invention can accommodate wafers with varying degrees of warpage or bow. For example, while the wafer 12 is shown throughout the figures as possessing only "simple" warpage (i.e., single, central curvature), wafers having more complex surfaces can also be accommodated (e.g., wafers having a "wavy" surface or those having offset curvature).

Advantageously, the present invention permits effective vacuum sealing of a semiconductor wafer to a vacuum chuck assembly regardless of wafer warpage. By effectively providing a vacuum seal to the warped wafer surface, manual intervention is not required to ensure coupling to the chuck assembly. Furthermore, the present invention permits effective vacuum sealing at lower vacuum pressures.

Exemplary embodiments of the present invention are described above. Those skilled in the art will recognize that many embodiments are possible within the scope of the invention. Variations, modifications, and combinations of the various parts and assemblies can certainly be made and still fall within the scope of the invention. Thus, the invention is limited only by the following claims, and equivalents thereto.

What is claimed is:

1. A vacuum chuck assembly for receiving and fixedly retaining a semiconductor wafer having a warped surface, the chuck assembly comprising:
   a vacuum chuck having:
      a planar engaging surface adapted to seal against and retain the wafer, the engaging surface being formed of a first material, wherein the planar engaging surface forms a ring; and
      at least one vacuum port in communication with the engaging surface; and
   a conforming flexible cup extending around a perimeter of the engaging surface, the cup adapted to form an air-tight seal between the engaging surface and the warped surface, wherein the cup maintains the air-tight seal until the warped surface deflects, under application of vacuum pressure, sufficiently to conform and seal against the engaging surface, wherein the flexible cup is formed of a second material which is more flexible than the first material.

2. The chuck assembly of claim 1, wherein the vacuum chuck further comprises a face side defining the planar engaging surface and a backside adapted to couple to a chuck receiving component.

3. A vacuum chuck assembly for receiving and fixedly retaining a semiconductor wafer having a warped surface, the chuck assembly comprising:

a vacuum chuck having:
- a planar engaging surface adapted to seal against and retain the wafer, the engaging surface being formed of a first material; and
- at least one vacuum port in communication with the engaging surface; and a conforming flexible cup extending around a perimeter of the engaging surface, the cup adapted to form an air-tight seal between the engaging surface and the warped surface, wherein the cup maintains the air-tight seal until the warped surface deflects, under application of vacuum pressure, sufficiently to conform and seal against the engaging surface, wherein the flexible cup is formed of a second material which is more flexible than the first material, and wherein the cup comprises a flared lip extending outwardly from the chuck in a funnel-like manner, the flared lip terminating at a lip edge.

4. A chuck assembly for receiving and fixedly retaining a semiconductor wafer having a warped surface, the chuck assembly comprising:

a vacuum chuck having:
a planar engaging surface adapted to seal against and retain the wafer; and
- at least one vacuum port in communication with the engaging surface; and a conforming flexible cup extending around a perimeter of the engaging surface, the cup adapted to form an air-tight seal between the engaging surface and the warped surface, wherein the cup maintains the air-tight seal until the warped surface deflects, under application of vacuum pressure, sufficiently to conform and seal against the engaging surface, wherein the cup comprises a flared lip extending outwardly from the chuck in a funnel-like manner, the flared lip terminating at a lip edge, and wherein the engaging surface extends beyond the lip edge.

5. The chuck assembly of claim 4, wherein the flexible cup is made of a rubber material.

6. A vacuum chuck assembly for receiving and fixedly retaining a semiconductor wafer having a warped surface, the chuck assembly comprising:

a vacuum chuck having:
- a planar engaging surface adapted to seal against and retain the wafer, the engaging surface being formed of a first material; and
- at least one vacuum port in communication with the engaging surface; and a conforming flexible cup extending around a perimeter of the engaging surface, the cup a adapted to form an air-tight seal between the engaging surface and the warped surface, wherein the cup maintains the air-tight seal until the warped surface deflects, under application of vacuum pressure, sufficiently to conform and seal against the engaging surface, wherein the flexible cup is formed of a second material which is more flexible than the first material, and wherein the chuck is made of a plastic material.

7. A vacuum chuck assembly for receiving and fixedly retaining a semiconductor wafer having a warped surface, the chuck assembly comprising:

a vacuum chuck having:
- a planar engaging surface adapted to seal against and retain the wafer, wherein the planar engaging surface forms a ring;
- at least one vacuum port in communication with the planar surface; and
- a recessed portion in communication with the engaging surface wherein the vacuum port is located within the recessed portion, the recessed portion being defined along its outer boundary by the planar engaging surface; and a conforming flexible cup extending around a perimeter of the engaging surface, the cup adapted to form an air-tight seal between the engaging surface and the warped surface, wherein the cup maintains the air-tight seal until the warped surface deflects, under application of vacuum pressure, sufficiently to conform and seal against the engaging surface;

wherein the cup and the chuck are nonintegral.

8. The chuck assembly of claim 7 wherein the cup is positively retained to the chuck.

9. The chuck assembly of claim 7 wherein the cup comprises a flared lip extending outwardly from the chuck in a funnel-like manner, the flared lip terminating at a lip edge.

10. A chuck assembly for receiving and fixedly retaining a semiconductor wafer having a warped surface, the chuck assembly comprising:

a vacuum chuck having:
- a planar engaging surface adapted to seal against and retain the wafer, wherein the planar engaging surface forms a ring;
- at least one vacuum part in communication with the planar surface; and
- a recessed portion in communication with the engaging surface wherein the vacuum port is located within the recessed portion, the recessed portion being defined along its outer boundary by the planar engaging surface; and a conforming flexible cup extending around a perimeter of the engaging surface, the cup adapted to form an air-tight seal between the engaging surface and the warped surface, wherein the cup maintains the air-tight seal until the warped surface deflects, under application of vacuum pressure, sufficiently to conform and seal against the engaging surface, wherein the cup comprises a flared lip extending outwardly from the chuck in a funnel-like manner, the flared lip terminating at a lip edge, and wherein the engaging surface extends beyond the lip edge.

11. A vacuum chuck assembly for receiving and retaining a semiconductor wafer having a warped surface, the chuck assembly comprising:

a cylindrical vacuum chuck having:
a face side, the face side having a planar, ring-shaped engaging surface adapted to contact the wafer and a recessed portion bounded by the engaging surface;
a backside adapted to couple the chuck to a chuck receiving component; and
at least one vacuum port located on the recessed portion, the vacuum port adapted to fluidly couple to a vacuum source; and
a conforming flexible cup extending around a perimeter of the engaging surface, the cup adapted to form an air-tight seal between the engaging surface and the warped surface, wherein the cup maintains the air-tight seal at least until the warped surface deflects, under application of vacuum pressure, sufficiently to conform the cup to the engaging surface,
wherein the cup and the chuck are nonintegral.

12. The chuck assembly of claim 11 wherein the cup comprises a soft rubber material.

13. The chuck assembly of claim 11 wherein the cup comprises a flared lip extending outwardly from the chuck in a funnel like manner, the flared lip terminating at a lip edge.

14. The chuck assembly of claim 11 wherein the vacuum port extends from the recessed portion to the backside.

15. The chuck assembly of claim 11 wherein the recessed portion further comprises one or more extension surfaces, the extension surfaces being substantially coplanar with the engaging surface.

16. A chuck assembly for receiving and retaining a semiconductor wafer having a warped surface, the chuck assembly comprising:
a cylindrical vacuum chuck having:
a face side, the face side having a planar, ring-shaped engaging surface adapted to contact the wafer and a recessed portion bounded by the engaging surface;
a backside adapted to couple the chuck to a chuck receiving component; and
at least one vacuum port located on the recessed portion, the vacuum port adapted to fluidly couple to a vacuum source; and
a conforming flexible cup extending around a perimeter of the engaging surface, the cup adapted to form an air-tight seal between the engaging surface and the warped surface, wherein the cup maintains the air-tight seal at least until the warped surface deflects, under application of vacuum pressure, sufficiently to conform the cup to the engaging surface,
wherein the cup comprises a flared lip extending outwardly from the chuck in a funnel-like manner, the flared lip terminating at a lip edge, and
wherein the engaging surface extends beyond the lip edge.

17. A chuck assembly for receiving and retaining a semiconductor wafer having a warped surface, the chuck assembly comprising:
a cylindrical vacuum chuck having:
a face side, the face side having a planar, ring-shaped engaging surface adapted to contact the wafer and a recessed portion bounded by the engaging surface;
a backside adapted to couple the chuck to a chuck receiving component; and
at least one vacuum port located on the recessed portion, the vacuum port adapted to fluidly couple to a vacuum source; and
a conforming flexible cup extending around a perimeter of the engaging surface, the cup adapted to form an airtight seal between the engaging surface and the warped surface, wherein the cup maintains the air-tight seal at least until the warped surface deflects, under application of vacuum pressure, sufficiently to conform the cup to the engaging surface, the cup having a flared lip extending outwardly from the chuck in a funnel-like manner and terminating at a lip edge,
wherein the engaging surface extends beyond the lip edge.

18. A chuck assembly for receiving and retaining a semiconductor wafer having a warped surface, the chuck assembly comprising:
a cylindrical vacuum chuck having:
a face side, the face side having a planar, ring-shaped engaging surface adapted to contact the wafer and a recessed portion bounded by the engaging surface;
a backside adapted to couple the chuck to a chuck receiving component; and
at least one vacuum port located on the recessed portion, the vacuum port adapted to fluidly couple to a vacuum source; and
a conforming flexible cup extending around a perimeter of the engaging surface, the cup adapted to form an air-tight seal between the engaging surface and the warped surface, wherein the cup maintains the air-tight seal at least until the warped surface deflects, under application of vacuum pressure, sufficiently to conform the cup to the engaging surface, the cup having a flared lip extending outwardly from the chuck in a tunnel-like manner and terminating at a lip edge,
wherein the cup further comprises a flange integrally adapted to mate with a groove on an outer surface of the chuck.

19. The chuck assembly of claim 18 wherein the cup further comprises a cup wall intermediate the flange and the flared lip, the cup wall generally surrounding a portion of the outer surface.

20. The chuck assembly of claim 19 wherein the cup wall, flared lip, and flange are integrally formed from a unitary piece of material.

21. The chuck assembly according to claim 18, wherein the flange extends radially inwardly into the groove.

22. The chuck assembly according to claim 18, wherein the cup includes a wall and the flange extends radially inwardly from the wall.

23. The chuck assembly according to claim 22, wherein the wall is elongate and the flange is positioned at one end of the wall.

24. The chuck assembly according to claim 23, wherein the flared lip is connected to the wall remote from the one end of the wall.

25. The chuck assembly according to claim 22, wherein the chuck is cylindrical and the wall is cylindrical, and the outer diameter of the chuck is greater than the inner diameter of the wall prior to installing the cup on the chuck.

26. The chuck assembly according to claim 18, wherein the flared lip tapers in thickness toward the lip edge.

27. The chuck assembly according to claim 18, wherein the groove extends around the entire periphery of the chuck.

28. A vacuum chuck assembly for receiving and retaining a semiconductor wafer having a warped surface, the chuck assembly comprising:
a cylindrical vacuum chuck having:
a face side, the face side having a planar, ring-shaped engaging surface adapted to contact the wafer; one or more extension surfaces, the extension surfaces being substantially coplanar with the engagement surface; and a recessed portion bounded by the engaging surface;

a backside adapted to couple the chuck to a chuck receiving component;

a groove located on an outer surface of the chuck; and at least one vacuum port located on the recessed portion, the vacuum port adapted to fluidly couple to a vacuum source; and a conforming flexible cup extending around a perimeter of the engaging surface and at least partially received in the groove, the cup adapted to form an air-tight seal between the engaging surface and the warped surface, wherein the cup comprises a soft rubber material that maintains the air-tight seal at least until the warped surface deflects, under application of vacuum pressure, sufficiently to conform the cup to the engaging surface.

29. The chuck assembly of claim 28 wherein the cup comprises a flared lip extending outwardly from the chuck in a funnel-like manner, the flared lip terminating at a lip edge.

30. The chuck assembly of claim 28 wherein the vacuum port extends from the face side to the backside.

31. The chuck assembly of claim 28 wherein the chuck further comprises fastening means to permit mounting of the chuck assembly to the chuck receiving component.

32. The chuck assembly of claim 31 wherein the fastening means comprises a through-hole adapted to receive a fastener.

33. The chuck assembly of claim 28 wherein the chuck is comprised of a plastic material.

34. A vacuum chuck assembly for receiving and retaining a semiconductor wafer having a warped surface, the chuck assembly comprising:

a cylindrical vacuum chuck having:
a face side, the face side having a planar, ring-shaped engaging surface adapted to contact the wafer; one or more extension surfaces, the extension being substantially coplanar with the engagement surface; and a recessed portion bounded by the engaging surface;

a backside adapted to couple the chuck to a chuck receiving component;

a groove located on an outer surface of the chuck; and at least one vacuum port located on the recessed portion, the vacuum port adapted to fluidly couple to a vacuum source; and a conforming flexible cup extending around a perimeter of the engaging surface, the cup adapted to form an air-tight seal between the engaging surface and the warped surface, wherein the cup comprises a soft rubber material that maintains the air-tight seal at least until the warped surface deflects, under application of vacuum pressure, sufficiently to conform the cup to the engaging surface, wherein the cup comprises a flared lip extending outwardly from the chuck in a funnel-like manner, the flared lip terminating at a lip edge, and wherein the engaging surface extends beyond the lip edge.

35. A vacuum chuck assembly for receiving and retaining a semiconductor wafer having a warped surface, the chuck assembly comprising:

a cylindrical vacuum chuck having:
a face side, the face side having a planar, ring-shaped engaging surface adapted to contact the wafer; one or more extension surfaces, the extension surfaces being substantially coplanar with the engagement surface; and a recessed portion bounded by the engaging surface;

a backside adapted to couple the chuck to a receiving component;

a groove located on an outer surface of the chuck; and at least one vacuum port located on the recessed portion, the vacuum port adapted to fluidly couple to a vacuum source; and a conforming flexible cup extending around a perimeter of the engaging surface, the cup adapted to form an air-tight seal between the engaging surface and the warped surface, wherein the cup comprises:
a soft rubber material that maintains the air-tight seal at least until the warped surface deflects, under application of vacuum pressure, sufficiently to conform the cup to the engaging surface;
a cylindrical cup wall substantially surrounding a portion of the outer surface;
a flared lip extending outwardly from a first end of the cup wall in a funnel-like manner, the flared lip terminating at a lip edge; and
a flange integrally formed on a second end of the cup wall opposite the first end, the flange adapted to mate with the groove on the outer surface of the chuck.

36. The chuck assembly of claim 35 wherein the engaging surface extends beyond the lip edge.

37. A method of securing a semiconductor wafer having a warped surface to a vacuum chuck comprising:

providing a chuck assembly, the chuck assembly having an engaging surface having at least one vacuum port thereon and a flexible cup extending around a perimeter of the engaging surface, the engaging surface adapted to receive a generally flat wafer surface;

positioning the engaging surface proximal the wafer;

activating a vacuum source fluidly coupled to the vacuum port to create vacuum pressure at the vacuum port;

deflecting the cup by application of vacuum pressure wherein the cup conforms to the warped surface and seals thereto; and continuing to apply vacuum pressure wherein the vacuum pressure deforms the wafer and draws it to the engaging surface.

38. The method of claim 37 further comprising forming an air-tight seal between the wafer and the engaging surface.

39. The method of claim 37 further comprising applying an external load to the wafer wherein the wafer remains fixed relative to the chuck assembly.

40. The method of claim 37 further comprising rotating the chuck assembly wherein the wafer remains fixed relative to the chuck assembly.

41. The method according to claim 37, wherein positioning the engaging surface proximal the wafer includes contacting the engaging surface on the wafer before the sealing member contacts the wafer.

42. The method according to claim 37, wherein the vacuum pressure provided by the vacuum source is less than 25 Hg.

43. The method according to claim 37, wherein the vacuum pressure provided by the vacuum source is about 5 Hg.

44. The method according to claim 37, wherein the vacuum pressure provided by the vacuum source is in the range of about 5–12 Hg.

45. The method according to claim 37, wherein deflecting the cup includes preventing a lip of the cup from folding-in and collapsing between the engaging surface and the wafer.

46. A vacuum chuck assembly for receiving and fixedly retaining a semiconductor wafer having a warped surface, the chuck assembly comprising:

a vacuum chuck having:
- a planar engaging surface adapted to seal against and retain the wafer, the engaging surface being formed of a first material; and
- at least one vacuum port in communication with the engaging surface; and a conforming flexible cup extending around a perimeter of the engaging surface, the cup adapted to form an air-tight seal between the engaging surface and the warped surface, wherein the cup maintains the air-tight seal until the warped surface deflects, under application of vacuum pressure, sufficiently to conform and seal against the engaging surface, wherein the flexible cup is formed of a second material which is more flexible than the first material, and wherein the cup includes a lip cantilevered from the engaging surface, the lip tapering toward a free edge thereof.

47. A vacuum chuck assembly for receiving and fixedly retaining a semiconductor wafer having a warped surface, the chuck assembly comprising:

a vacuum chuck having:
- a planar engaging surface adapted to seal against and retain the wafer, the engaging surface being formed of a first material; and
- at least one vacuum port in communication with the engaging surface; and a conforming flexible cup extending around a perimeter of the engaging surface, the cup adapted to form an air-tight seal between the engaging surface and the warped surface, wherein the cup maintains the air-tight seal until the warped surface deflects, under application of vacuum pressure, sufficiently to conform and seal against the engaging surface, wherein the flexible cup is formed of a second material which is more flexible than the first material, and wherein the first material is rigid plastic, and the second material is flexible rubber.

* * * * *

UNITED STATES PATENT AND TRADEMARK OFFICE
CERTIFICATE OF CORRECTION

PATENT NO. : 6,279,976 B1  
DATED : August 28, 2001  
INVENTOR(S) : Michael B. Ball Page 1 of 1

It is certified that error appears in the above-identified patent and that said Letters Patent is hereby corrected as shown below:

<u>Column 12,</u>  
Line 29, delete "tunnel-like" and insert -- funnel-like --, therefor.

<u>Column 13,</u>  
Line 38, insert -- surfaces -- between "extension" and "being".

Signed and Sealed this

Twenty-third Day of April, 2002

Attest:

JAMES E. ROGAN  
*Attesting Officer*   *Director of the United States Patent and Trademark Office*